Aug. 28, 1962 D. P. MARGOLIS ET AL 3,050,843

METHOD OF BONDING METALLIC MEMBERS

Filed April 15, 1959

INVENTORS: D. P. MARGOLIS
E. G. WALSH
BY H W Lockhart
ATTORNEY

United States Patent Office
3,050,843
Patented Aug. 28, 1962

3,050,843

METHOD OF BONDING METALLIC MEMBERS

David P. Margolis, Murray Hill, and Edward G. Walsh, Madison, N.J., assignors to Bell Telephone Laboratories, Incorporated, New York, N.Y., a corporation of New York Filed Apr. 15, 1959, Ser. No. 806,560
4 Claims. (Cl. 29—470)

Figure 1:
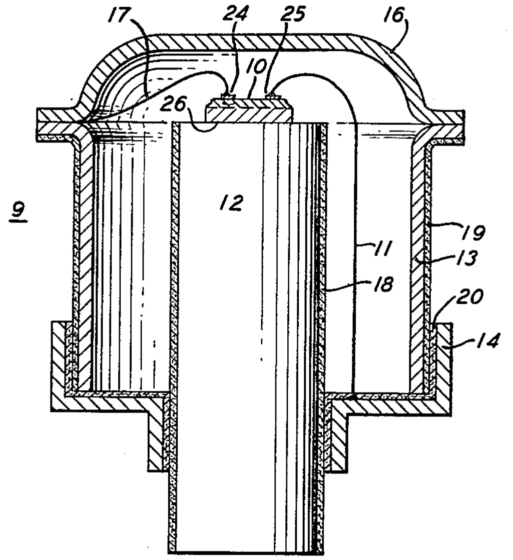

This invention relates to methods for bonding metals and more particularly to methods for forming hermetic seals between metal components.

The invention has special application to the hermetic and electrically insulated sealing of metal components of semiconductor housings, and accordingly, it will be described specifically with respect to this problem, although its wider applicability is obvious.

In the production of semiconductor diodes and transistors ohmic connection is made to the semiconductor crystal through two or three electrodes, respectively. Leads are then attached to these electrodes to provide useable circuit components.

Furthermore, it is found characteristic that the electrical properties of the semiconductor crystal are affected by the surface conditions of the crystal. Therefore, the surface conditions must be controlled. This is often accomplished by enclosing the crystal in a protective metallic envelope called an encapsulation or housing. These encapsulations must be hermetically sealed to be suitable. Since the leads must pass through the encapsulation, the problem of hermetically sealing the encapsulation is further complicated by the need to insulate the leads from the encapsulation.

Often semiconductor devices have one electrode connected directly to the encapsulation. Some semiconductor devices have all their electrodes connected directly to the encapsulation. In these cases, the several portions of the encapsulation to which these electrodes are connected must be insulated from each other while the encapsulation remains hermetically sealed.

This has been accomplished in the prior art by making bonds between glass and metals such as Kovar or between alumina and metals such as nickel. These methods are costly and usually require some critical hand operations.

Therefore, one object of this invention is an inexpensive method of encapsulating semiconductor crystals.

A more specific object is an insulating hermetic seal between components of metallic encapsulations of semiconductor crystals.

A broader object is a method for bonding together two metals of the kind to be described.

Metals such as strontium, hafnium, aluminum, titanium, columbium, tantalum, tungsten and zirconium are characterized by a readiness to grow thin oxide films when exposed to the air and a thick, uniform, and strongly adherent dielectric film under controlled conditions. Such metals are herein referred to as "film-forming" metals. In the past when it has been desired to form a bond between such metals, the film usually has been considered undesirable and has been removed.

This invention is based on the discovery that two members of a film-forming metal can be bonded through the medium of thick grown oxide films or layers to form an insulating layered structure, the degree of insulation being proportional to the oxide thickness. This layered structure when properly treated also provides a good hermetic seal.

Therefore, one feature of this invention is the bonding of members of a film-forming metal through relatively thick grown oxide layers.

Another feature is an insulating layered structure suitable for semiconductor encapsulations.

The invention has special application when the metal is aluminum.

Figure 2:
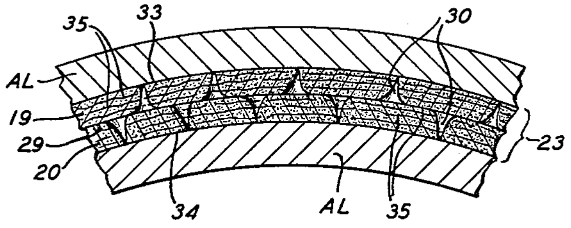

Further objects and features of the invention will be brought out in the course of the description which is rendered below with reference to the accompanying drawings in which:

FIG. 1 is a cross-sectional view of a transistor fabricated in accordance with the present invention; and FIG. 2 is a microscopic cross section of an insulating oxide layered structure.

In FIG. 1 the collector region of a diffused base transistor 10 of the kind described in copending application Serial No. 496,202 filed March 23, 1955, is secured to one end of an aluminum stud 12. The tubular aluminum casing member 13 has an oxide layer 19 grown on its external surface as shown. The cup-like aluminum casing member 14 has a similar oxide layer 20 grown on its internal surface and insulating contact is made between aluminum casing members 13 and 14 by forming a bond between the grown oxide layers 19 and 20. Similarly, an oxide layer 18 is grown on the aluminum stud 12 and insulating contact is made between the aluminum stud 2 and aluminum casing member 14 by forming a bond between the grown oxide layers 18 and 20. Emitter lead 11 is suitably soldered to aluminum casing member 14 and base lead 17 is attached to aluminum casing member 13. The aluminum casing member 16 is then welded to aluminum casing member 13 to provide an electrical connection. The device 9 now has the base and emitter electrodes 24 and 25 connected to the casing members 13 and 14, respectively, and collector electrode 26 connected to the aluminum stud 12 so that the electrodes are insulated from each other.

FIG. 2 depicts in microscopic enlargement the nature of the insulating layered structure between, for example, the casing members 13 and 14 of the device shown in FIG. 1. Oxide layers 19 and 20 bond along the interface 29. It is found characteristic that pores 30 form in these oxide layers as shown. These pores orient themselves perpendicularly to the aluminum surfaces 33 and 34. Furthermore, the oxide layers have a different rate of expansion than the aluminum and the application of heat causes cracks 35 to appear. Some of these cracks form a continuous path parallel to aluminum surfaces 33 and 34. Also the interface 29 between the grown oxide layers 19 and 20 forms a continuous path parallel to the aluminum surfaces 33 and 34.

The efficiency of a hermetic seal which includes such a layered structure depends on either avoiding or filling the unfilled continuous paths 35 parallel to the aluminum surfaces 33 and 34. Advantageously, these cracks may be filled by such well-known methods of sealing as boiling in water free of contaminants, typically de-ionized or distilled water, or treating the oxide in a solution of nickel or cobalt acetate. Residual water may be removed by baking the finished device at an elevated temperature.

The cracks 35 may be avoided by utilizing as the casing material, instead of solid aluminum, an aluminum clad metal in which the initial aluminum thickness is small, and the rate of expansion of the substrate metal, such as steel, is more nearly that of aluminum oxide. For example, the rate of expansion at 20 degrees centigrade (length per unit length per degree centrigrade) of aluminum oxide is $8.7\times10^{-6}$ and that of low carbon steel is $10.5\times10^{-6}$ while that of aluminum is $25\times10^{-6}$.

A typical hermetic seal, in accordance with the present invention, may be fabricated in the following manner: the external surface of a tubular aluminum member and the internal surface of an aluminum cap, the internal diameter of which is slightly less than the external diameter of said tubular aluminum member, the two surfaces to be bonded are coated with a grown oxide layer. The term "grown oxide layer" as used throughout this application designates an artificially produced coating consisting of metallic oxide on the metal substrate, which coating is formed by chemical or electrochemical treatment, and is of a thickness greater than the oxide layer of several thousand Angstroms which is naturally formed on film-forming metal surfaces by contact with the air. Suitable grown oxide coatings are typically 0.0005 inch to 0.0015 inch thick. The thickness of each layer should be adequate to make possible a strong and hermetic bond between the two elements, and a thickness advantageously of .003 inch and at least in excess of .0005 inch is found necessary. Moreover, the total thickness of the bonded layers controls the degree of electrical isolation, i.e., the thicker the bonded layers the better the isolation. The upper limit on thickness is merely one of expediency and may be produced, for example, on aluminum surfaces by a number of well-known methods, such as by immersing the article to be coated for a short time in a hot solution of an alkali carbonate containing a small amount of an inhibitor, such as chromate, or by making the aluminum member the anode in an electrolyte consisting of an acid solution, such as sulfuric acid, chromic acid, oxalic acid, or mixtures of these acids. The aluminum cap then is heated to a temperature typically in the range from 340 to 370 degrees Fahrenheit, about 350 degrees Fahrenheit being found most suitable, and "shrink fitted" to the tubular member.

The "shrink fitting" step is only one means of supplying the pressure necessary to produce the desired oxide to oxide bond, this step being convenient to the geometry of the aluminum members being sealed in the embodiment being described. Alternatively, when this technique is not feasible because the geometry is unsuitable, the bond may be provided by placing the oxidized surfaces to be bonded in a face-to-face relationship and applying at a temperature advantageously in the range from 340 to 370 degrees Fahrenheit, pressures ranging from 10,000 p.s.i. to 40,000 p.s.i., in a direction substantially perpendicular to these surfaces.

The bonded insulating oxide layers are sealed by boiling in de-ionized water for 10 to 45 minutes and the entire structure then is baked at about 500 degrees Fahrenheit for two hours to remove the residual water. A temperature range of 350 to 500 degrees Fahrenheit is most suitable for this baking step, and the length of time necessary ranges from one half to several hours depending on the design of the device and the electrical characteristics desired.

A hermetic seal, in accordance with the present invention, was fabricated as follows: an aluminum cap, the inside dimension of which was 0.36 inch was anodized by making the cap the anode in an electrolyte consisting of a solution of sulfuric acid as described above. The anodizing time was 45 minutes to form an oxide film about 0.001 inch thick. The cap then was heated to a temperature of 350 degrees Fahrenheit and fitted to a similarly anodized aluminum tube which was at room temperature, and the outside diameter of which was 0.3615 inch. Both the cap and the tube were 0.0625 inch thick. The cap was slowly allowed to cool to room temperature in order to shrink the cap to the tube. The resulting structure was first boiled in de-ionized water for 30 minutes and thereafter baked at 500 degrees Fahrenheit for four hours. No reduction in the thickness of the aluminum members was detected.

The structure was tested with a helium leak detector with a sensitivity of $10^{-10}$ cc./sec. at 760 mm. pressure and zero degrees centigrade and found to be hermetic. Also for a voltage difference of 40 volts between the two aluminum members, the leakage current was less than a tenth of a microampere.

No effort has been made to describe all possible embodiments of the invention. It should be understood that the embodiment described is merely illustrative of the preferred form of the invention and various modifications may be made therein without departing from the scope and spirit of this invention.

For example, other film-forming metals described can be used instead of aluminum with similar results.

What is claimed is:

1. The method of bonding two members of metals characterized by a readiness to grow thin oxide films when exposed to the air and a thick, uniform and strongly adherent dielectric film under controlled conditions at an elevated temperature comprising growing an oxide layer on each metallic surface portion, each of said oxide layers being at least .0005 inch thick, arranging said members with the oxide layers thereof in face-to-face contacting relation, and applying to the members a pressure of between 10,000 and 40,000 p.s.i. substantially at right angles to said oxide layers at the insulating bond forming temperature for that pressure.

2. The method of bonding two aluminum members at an elevated temperature comprising growing an oxide layer on each aluminum surface portion, each of said oxide layers being at least .0005 inch thick, arranging said members with the oxide layers thereof in face-to-face contacting relation, applying to the members at an ambient temperature of between 340 degrees Fahrenheit to 370 degrees Fahrenheit, a pressure of between 10,000 and 40,000 p.s.i. substantially at right angles to said oxide layers to form an insulating aluminum oxide to aluminum oxide bond.

3. The method of physically joining two aluminum members in an electrically insulating manner comprising growing an oxide layer on at least one surface of each member, each of said oxide layers being at least .0005 inch thick, arranging said layers with said oxide layers in contact and applying a pressure of between 10,000 to 40,000 p.s.i. at a temperature of between 340 to 370 degrees Fahrenheit.

4. A method for forming an insulating hermetic seal comprising the steps of growing an oxide layer on a surface of each of two aluminum piece parts, each of said oxide layers being at least .0005 inch thick, bonding said oxide layers by applying a pressure of between 10,000 and 40,000 p.s.i. at a temperature of between 340 and 370 degrees Fahrenheit, boiling the resulting layered structure in de-ionized water and baking to remove the residual water.

References Cited in the file of this patent

UNITED STATES PATENTS

| | | |
|---|---|---|
| 2,336,488 | Litton | Dec. 14, 1943 |
| 2,564,738 | Tank | Aug. 21, 1951 |
| 2,698,548 | Sowter | Jan. 4, 1955 |

FOREIGN PATENTS

| | | |
|---|---|---|
| D. 16,645 | Germany | Aug. 30, 1956 |
| 953,450 | Germany | Nov. 29, 1956 |
| 784,939 | Great Britain | Oct. 23, 1957 |